(12) United States Patent
Li et al.

(10) Patent No.: US 12,557,498 B2
(45) Date of Patent: Feb. 17, 2026

(54) LIGHT EMITTING PANEL AND PREPARATION METHOD THEREOF, AND LIGHT EMITTING APPARATUS

(71) Applicants: Chengdu BOE Optoelectronics Technology Co., Ltd., Sichuan (CN); BOE Technology Group Co., Ltd., Beijing (CN)

(72) Inventors: Zeliang Li, Beijing (CN); Tao Gao, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 552 days.

(21) Appl. No.: 18/021,811

(22) PCT Filed: Apr. 21, 2022

(86) PCT No.: PCT/CN2022/088297
§ 371 (c)(1),
(2) Date: Feb. 17, 2023

(87) PCT Pub. No.: WO2023/201657
PCT Pub. Date: Oct. 26, 2023

(65) Prior Publication Data
US 2024/0268163 A1    Aug. 8, 2024

(51) Int. Cl.
*H10K 59/12* (2023.01)
*H10K 59/131* (2023.01)

(52) U.S. Cl.
CPC ....... *H10K 59/131* (2023.02); *H10K 59/1201* (2023.02)

(58) Field of Classification Search
CPC .. H10K 59/00; H10K 59/1201; H10K 59/122; H10K 59/131
See application file for complete search history.

(56) References Cited

U.S. PATENT DOCUMENTS

2018/0226460 A1    8/2018  Zhu et al.
2019/0019978 A1    1/2019  Kim et al.
(Continued)

FOREIGN PATENT DOCUMENTS

CN    107978622 A    5/2018
CN    108598131 A    9/2018
(Continued)

*Primary Examiner* — Jaehwan Oh
(74) *Attorney, Agent, or Firm* — Ling Wu; Stephen Yang; Ling and Yang Intellectual Property

(57) ABSTRACT

Disclose is a light emitting panel, including: a display region and a peripheral region located on at least one side of the display region. The display region is provided with at least one light emitting element. The light emitting element includes: a first electrode, a second electrode, and an organic emitting layer disposed between the first electrode and the second electrode. In a direction perpendicular to the light emitting panel, the light emitting panel at least includes: a base substrate, and a first conductive layer and a second conductive layer located on the base substrate. The first conductive layer includes at least one first signal trace. The second conductive layer includes the first electrode of the light emitting element. The first conductive layer is in direct contact with the second conductive layer, and the first electrode of the light emitting element is connected with the first signal trace.

20 Claims, 10 Drawing Sheets

(56) References Cited

U.S. PATENT DOCUMENTS

| | | | |
|---|---|---|---|
| 2019/0363307 A1* | 11/2019 | Cheng | H10K 59/80516 |
| 2023/0057673 A1* | 2/2023 | Asaoka | H10H 29/142 |
| 2023/0247873 A1 | 8/2023 | Kubota et al. | |

FOREIGN PATENT DOCUMENTS

| | | |
|---|---|---|
| CN | 109244106 A | 1/2019 |
| CN | 110943111 A | 3/2020 |
| CN | 113140606 A | 7/2021 |
| WO | 2021140535 A1 | 7/2021 |
| WO | 2022003504 A1 | 1/2022 |

\* cited by examiner

LIGHT EMITTING PANEL AND PREPARATION METHOD THEREOF, AND LIGHT EMITTING APPARATUS

CROSS-REFERENCE TO RELATED APPLICATION

The present application is a U.S. National Phase Entry of International Application No. PCT/CN2022/088297 having an international filing date of Apr. 21, 2022. The entire contents of the above-identified application are hereby incorporated by reference.

TECHNICAL FIELD

The present disclosure relates to, but is not limited to, the field of display technologies, and particularly to a light emitting panel and a preparation method thereof, and a light emitting apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc.

SUMMARY

The following is a summary of subject matters described herein in detail. The summary is not intended to limit the protection scope of claims.

Embodiments of the present disclosure provide a light emitting panel and a preparation method thereof, and a light emitting apparatus.

In one aspect, an embodiment provides a light emitting panel, including: a display region and a peripheral region located on at least one side of the display region. The display region is provided with at least one light emitting element, and the light emitting element includes a first electrode, a second electrode, and an organic emitting layer disposed between the first electrode and the second electrode. In a direction perpendicular to the light emitting panel, the light emitting panel at least includes: a base substrate, and a first conductive layer and a second conductive layer disposed on the base substrate. The first conductive layer includes: at least one first signal trace. The second conductive layer includes: a first electrode of the light emitting element. Among them, the first conductive layer is in direct contact with the second conductive layer, and the first electrode of the light emitting element is directly connected with the first signal trace; or, a first insulation layer is disposed between the first conductive layer and the second conductive layer, the first electrode of the light emitting element is connected with the first signal trace through a via provided in the first insulation layer, and an orthographic projection of the first insulation layer on the base substrate is overlapped with an orthographic projection of a part of the light emitting element used for emitting light on the base substrate.

In some exemplary implementation modes, the first signal trace in the display region includes: a first extension portion; the first extension portion is grid-shaped, and an orthographic projection of the first extension portion on the base substrate is overlapped with an orthographic projection of the first electrode of the light emitting element electrically connected with the first signal trace on the base substrate.

In some exemplary implementation modes, the first signal trace further includes: a second extension portion, the second extension portion extends from the display region to the peripheral region, and the second extension portion is connected with the first extension portion.

In some exemplary implementation modes, the display region is further provided with at least one auxiliary trace, and the auxiliary trace and the first electrode of the light emitting element are of a same-layer structure. The auxiliary trace is in direct contact with the second extension portion of the first signal trace, and an orthographic projection of the auxiliary trace on the base substrate is overlapped with an orthographic projection of the second extension portion of the first signal trace on the base substrate.

In some exemplary implementation modes, the second conductive layer is in direct contact with the first conductive layer, and the second conductive layer is located on a side of the first conductive layer away from the base substrate.

In some exemplary implementation modes, in the display region, an orthographic projection of the second conductive layer on the base substrate covers an orthographic projection of the first conductive layer on the base substrate.

In some exemplary implementation modes, in the peripheral region, an orthographic projection of the second conductive layer on the base substrate is partially overlapped with an orthographic projection of the first conductive layer on the base substrate.

In some exemplary implementation modes, the second conductive layer is in direct contact with the first conductive layer, and the second conductive layer is located on a side of the first conductive layer close to the base substrate.

In some exemplary implementation modes, the display region is further provided with a pixel definition layer having multiple pixel openings, a pixel opening exposes at least a portion of the first electrode of the light emitting element; the organic emitting layer of the light emitting element is in contact with the first electrode of the light emitting element through the pixel opening; the second electrode of the light emitting element is located on a side of the pixel definition layer away from the base substrate, and the second electrode of the light emitting element is in contact with the organic emitting layer of the light emitting element; a part of the light emitting element located at the pixel opening is used for emitting light.

In some exemplary implementation modes, the peripheral region is provided with multiple barrier dams, at least one of the multiple barrier dams surrounds the display region; the multiple barrier dams and the pixel definition layer are of a same-layer structure, and the multiple barrier dams are sequentially and continuously arranged along a direction away from the display region.

In some exemplary implementation modes, along the direction away from the display region, a total length of the multiple barrier dams is greater than 144 microns.

In some exemplary implementation modes, a material of the first conductive layer includes a metal material, and a material of the second conductive layer includes a transparent conductive material.

In another aspect, an embodiment provides a light emitting apparatus, including: the light emitting panel as described above.

In another aspect, an embodiment provides a preparation method of a light emitting panel. The light emitting panel includes a display region and a peripheral region located on at least one side of the display region; the display region is provided with at least one light emitting element, the light emitting element includes a first electrode, a second electrode, and an organic emitting layer disposed between the first electrode and the second electrode. The preparation method includes: forming a first conductive layer and a second conductive layer on a base substrate. The first conductive layer includes at least one first signal trace, and the second conductive layer includes: a first electrode of the light emitting element; the first conductive layer is in direct contact with the second conductive layer, and the first electrode of the light emitting element is connected with the first signal trace.

In some exemplary implementation modes, the first signal trace in the display region includes: a first extension portion; the first extension portion is grid-shaped, and an orthographic projection of the first extension portion on the base substrate is overlapped with an orthographic projection of the first electrode of the light emitting element electrically connected with the first signal trace on the base substrate.

In some exemplary implementation modes, the forming the first conductive layer and the second conductive layer on the base substrate includes: sequentially forming the first conductive layer and the second conductive layer that are in direct contact on the base substrate, wherein in the display region, an orthographic projection of the second conductive layer on the base substrate covers an orthographic projection of the first conductive layer on the base substrate; or, sequentially forming the second conductive layer and the first conductive layer that are in direct contact on the base substrate.

In some exemplary implementation modes, the preparation method further includes: forming a pixel definition layer on the base substrate, wherein the pixel definition layer has multiple pixel openings, a pixel opening exposes at least a portion of the first electrode of the light emitting element; and forming an organic emitting layer and a second electrode of the light emitting element; wherein the organic emitting layer of the light emitting element is in contact with the first electrode of the light emitting element through the pixel opening; the second electrode of the light emitting element is in contact with the organic emitting layer of the light emitting element.

In another aspect, an embodiment provides a preparation method of a light emitting panel. The light emitting panel includes a display region and a peripheral region located on at least one side of the display region; the display region is provided with at least one light emitting element, the light emitting element includes a first electrode, a second electrode, and an organic emitting layer disposed between the first electrode and the second electrode. The preparation method includes: sequentially forming a first conductive layer, a first insulation layer, and a second conductive layer on a base substrate. The first conductive layer includes at least one first signal trace, the second conductive layer includes: a first electrode of the light emitting element, the first electrode of the light emitting element is connected with the first signal trace through a via provided in the first insulation layer, and an orthographic projection of the first insulation layer on the base substrate is overlapped with an orthographic projection of a part of the light emitting element used for emitting light on the base substrate.

Other aspects will become apparent upon reading and understanding accompanying drawings and detailed description.

BRIEF DESCRIPTION OF DRAWINGS

The accompanying drawings are used for providing an understanding of technical solutions of the present disclosure, constitute a portion of the specification, and are used for explaining the technical solutions of the present disclosure together with the embodiments of the present disclosure and not intended to form limitations on the technical solutions of the present disclosure. Shapes and sizes of one or more components in the drawings do not reflect true scales, and are only intended to schematically describe contents of the present disclosure.

DETAILED DESCRIPTION

Figure 1:
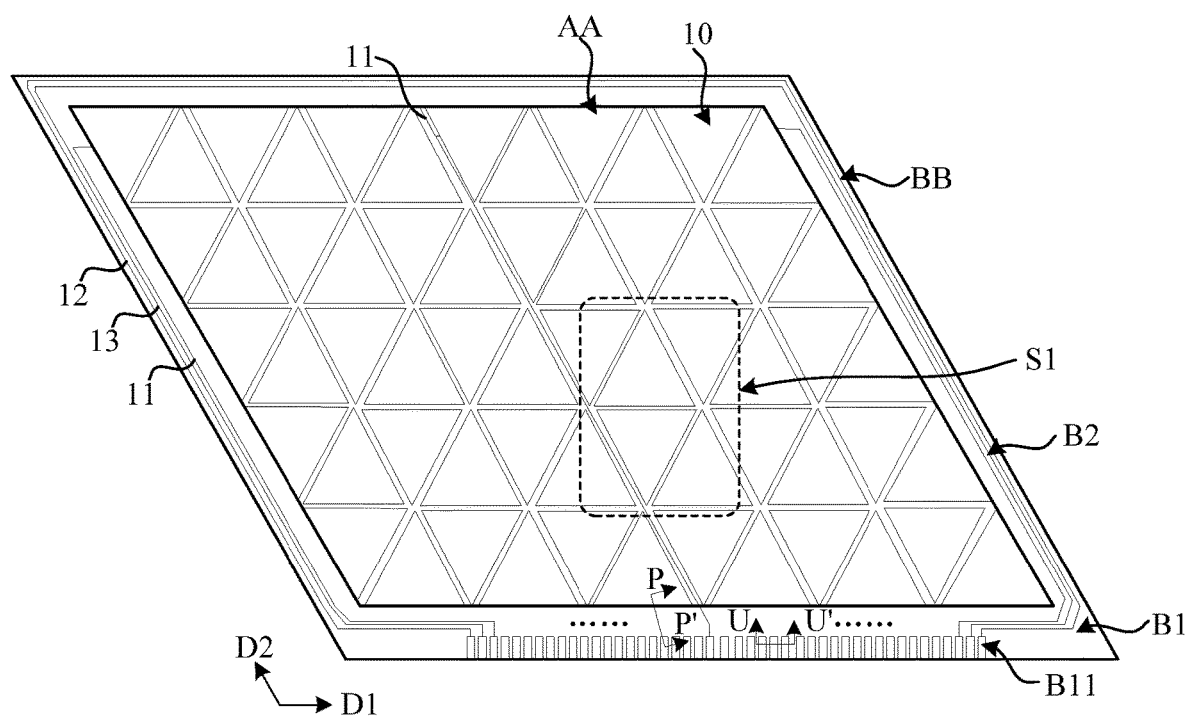
FIG. 1 is a schematic diagram of a light emitting panel according to at least one embodiment of the present disclosure.

The embodiments of the present disclosure will be described below in combination with the drawings in detail. Implementation modes may be implemented in multiple different forms. Those of ordinary skills in the art may easily understand such a fact that modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one mode of the present disclosure is not limited to shapes, numerical values, or the like shown in the drawings.

Ordinal numerals such as "first", "second", and "third" in the present disclosure are set to avoid confusion of constituent elements, but not intended for restriction in quantity. In the present disclosure, "multiple" represents two or more than two.

In the present disclosure, for convenience, wordings "central", "up", "down", "front", "back", "vertical", "horizontal", "top", "bottom", "inside", "outside" and the like indicating orientations or positional relationships are used for illustrating positional relationships between constituent elements with reference to the drawings. These wordings are not intended to indicate or imply that a referred apparatus or element must have a specific orientation and be structured and operated in the specific orientation, but only to facilitate describing the specification and simplify the description, and thus should not be understood as limitations on the present disclosure. The positional relationships between the constituent elements are changed as appropriate according to directions which are used for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skills in the art may understand meanings of the above-mentioned terms in the present disclosure according to situations. Among them, an "electrical connection" includes a case where constituent elements are connected together through an element with a certain electrical effect. The "element with the certain electrical effect" is not particularly limited as long as electrical signals between the connected constituent elements may be transmitted. Examples of the "element with the certain electrical effect" not only include electrodes and wires, but also include switching elements (such as transistors), resistors, inductors, capacitors, and other elements with one or more functions, etc.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

In the present disclosure, "about" and "substantially" refer to a case that a boundary is not defined strictly and a process and measurement error within a range is allowed.

An embodiment of the present disclosure provides a light emitting panel, which may improve a display effect of the light emitting panel and reduce a cost.

The light emitting panel provided by the embodiment of the present disclosure includes: a display region and a peripheral region located on at least one side of the display region. The display region is provided with at least one light emitting element. The light emitting element includes a first electrode, a second electrode, and an organic emitting layer disposed between the first electrode and the second electrode. In a direction perpendicular to the light emitting panel, the light emitting panel at least includes: a base substrate, and a first conductive layer and a second conductive layer disposed on the base substrate. The first conductive layer includes: at least one first signal trace. The second conductive layer at least includes: a first electrode of the light emitting element. Among them, the first conductive layer is in direct contact with the second conductive layer, and the first electrode of the light emitting element is directly connected with the first signal trace. Or, a first insulation layer is disposed between the first conductive layer and the second conductive layer, the first electrode of the light emitting element is connected with the first signal trace through a via provided in the first insulation layer, and an orthographic projection of the first insulation layer on the base substrate is overlapped with an orthographic projection of a part of the light emitting element used for emitting light on the base substrate. In this example, the part of the light emitting element used for emitting light may refer to a stacked portion of the first electrode, the organic emitting layer, and the second electrode of the light emitting element.

In some exemplary implementation modes, no insulation layer is provided between the first conductive layer and the second conductive layer of the light emitting panel, and the first signal trace of the first conductive layer and the first electrode of the light emitting element of the second conductive layer may be directly connected. The exemplary embodiment may reduce a preparation process of the light emitting panel and greatly reduce a cost.

In some exemplary implementation modes, the first conductive layer is located on a side of the second conductive layer close to the base substrate. The first insulation layer may be disposed between the first conductive layer and the second conductive layer, the first electrode of the light emitting element may be connected with the first signal trace through the via provided in the first insulation layer, and the orthographic projection of the first insulation layer on the base substrate may be overlapped with the orthographic projection of the part of the light emitting element used for emitting light on the base substrate. In the exemplary embodiment, by retaining the first insulation layer below the part of the light emitting element used for light emitting, it is possible to avoid a case where uneven first electrode of the light emitting element affects a display effect due to residue generated by etching the first insulation layer.

In some exemplary implementation modes, the first signal trace in the display region may include: a first extension portion; the first extension portion may be grid-shaped, and an orthographic projection of the first extension portion on the base substrate may be overlapped with an orthographic projection of the first electrode of the light emitting element electrically connected with the first signal trace on the base substrate. For example, the orthographic projection of the first electrode of the light emitting element on the base substrate may cover the orthographic projection of the first extension portion of the electrically connected first signal trace on the base substrate. In this way, damage to the first conductive layer during preparation of the first electrode may be prevented. In this example, a resistance of the first signal trace may be reduced by providing the grid-shaped first extension portion. Moreover, the grid-shaped first extension portion is in contact with the first electrode of the light emitting element, a uniform current may be applied to the first electrode, so that the light emitting panel may emit light with uniform brightness.

In some exemplary implementation modes, the first signal trace may further include: a second extension portion, the second extension portion may extend from the display region to the peripheral region, and the second extension portion is connected with the first extension portion. For example, the first extension portion and the second extension portion of the first signal trace may be of an integral structure. The second extension portion of the first signal trace extends to the peripheral region and may be electrically connected with a bonding pin of a bonding region. In some examples, the second extension portion of the first signal trace and a corresponding electrically connected bonding pin may be of an integrally structure.

In some exemplary implementation modes, the display region may be further provided with at least one auxiliary trace, and the auxiliary trace and the first electrode of the light emitting element are of a same-layer structure. The auxiliary trace is in direct contact with the second extension portion of the first signal trace, and an orthographic projection of the auxiliary trace on the base substrate may be overlapped with an orthographic projection of the second extension portion of the first signal trace on the base substrate. For example, in the display region, the orthographic projection of the auxiliary trace on the base substrate may cover the orthographic projection of the second extension portion of the first signal trace on the base substrate. In this way, the second extension portion of the first signal trace may be protected using the auxiliary trace in the display region to prevent damage to the first conductive layer during preparation of the auxiliary trace.

In some exemplary implementation modes, the second conductive layer is in direct contact with the first conductive layer, and the second conductive layer is located on a side of the first conductive layer away from the base substrate. In some examples, in the display region, an orthographic projection of the second conductive layer on the base substrate may cover an orthographic projection of the first conductive layer on the base substrate. In this example, the first conductive layer is protected using the second conductive layer in the display region, which may prevent the first conductive layer from being damaged in a preparation process, and may save a preparation process, thereby greatly reducing a cost. In some examples, in the peripheral region, an orthographic projection of the second conductive layer on the base substrate may be partially overlapped with an orthographic projection of the first conductive layer on the base substrate. In this example, side surfaces of a trace of the first conductive layer and a pin may be surfaced with the second conductive layer in the peripheral region to achieve an anti-corrosion effect.

In some exemplary implementation modes, the second conductive layer is in direct contact with the first conductive layer, and the second conductive layer may be located on a side of the first conductive layer close to the base substrate.

In some exemplary implementation modes, the display region may be further provided with a pixel definition layer, which may have multiple pixel openings, a pixel opening may expose at least a portion of the first electrode of the light emitting element. The organic emitting layer of the light emitting element may be in contact with the first electrode of the light emitting element through the pixel opening. The second electrode of the light emitting element may be located on a side of the pixel definition layer away from the base substrate, and the second electrode of the light emitting element may be in contact with the organic emitting layer of the light emitting element. A part of the light emitting element located at the pixel opening is used for emitting light. In some examples, a part of the light emitting element used for emitting light may include multiple sub-light emitting regions. Adjacent sub-light emitting regions may be separated by the pixel definition layer. Organic emitting layers in adjacent sub-light emitting regions may be communicated or may not be communicated. A sub-light emitting region may be a region corresponding to a pixel opening of the pixel definition layer.

In some exemplary implementation modes, the peripheral region may be provided with multiple barrier dams, the multiple barrier dams and the pixel definition layer may be of a same-layer structure, and at least one barrier dam may surround the display region. Multiple barrier dams may be sequentially and continuously arranged along a direction away from the display region. In some examples, five consecutive barrier dams may be provided in the peripheral region. For example, a total length of the multiple barrier dams along a direction away from the display region may be greater than 144 microns, for example, may be about 360 microns. By setting a certain number of barrier dams, an encapsulation layer made of an organic material may be effectively blocked.

In some exemplary implementation modes, a material of the first conductive layer may include a metal material, and a material of the second conductive layer may include a transparent conductive material. A bottom emission structure may be adopted for the light emitting panel provided in this example, that is, light is emitted from one side of the base substrate. However, this embodiment is not limited thereto.

A structure of the embodiment will be described below through some examples.

FIG. 1 is a schematic diagram of a light emitting panel according to at least one embodiment of the present disclosure. In some exemplary implementation modes, as shown in FIG. 1, the light emitting panel may include a display region AA and a peripheral region BB located at a periphery of the display region AA. The peripheral region BB may include: a bonding region B1 located on a side of the display region AA and a bezel region B2 located on another side of the display region AA. For example, the peripheral region BB may be located around the display region AA, the bonding region B1 may be located on a lower side of the display region AA, and the bezel region B2 may include regions on a left side, an upper side, and a right side of the display region AA. However, this embodiment is not limited thereto. For example, the peripheral region BB may be located on at least one side of the display region AA, and the bonding region B1 may be located on the upper side, the left side, or the right side of the display region AA.

In some examples, as shown in FIG. 1, the display region AA of the light emitting panel may be in a shape of a quadrangle. For example, it may be in a shape of a parallelogram. However, this embodiment is not limited thereto. For example, the display region AA of the light emitting panel may be in another shape such as a circle, an ellipse, a rectangle, a pentagon, or a hexagon.

In some examples, as shown in FIG. 1, the display region AA may be provided with multiple light emitting elements 10. The multiple light emitting elements 10 may be regularly arranged within the display region AA. For example, the multiple light emitting elements 10 may be arranged in multiple columns along a first direction D1 and arranged in multiple rows along a second direction D2 within the display region AA. Among them, multiple light emitting elements 10 arranged along the first direction D1 may be referred to as a row of light emitting elements, and multiple light emitting elements 10 arranged along the second direction D2 may be referred to as a column of light emitting elements. The light emitting panel shown in FIG. 1 may include ten rows and twelve columns of light emitting elements 10, each row may include six light emitting elements 10 and each column may include five light emitting elements 10. The light emitting panel shown in FIG. 1 may include a total of sixty light emitting elements 10. However, a quantity of light emitting elements 10 included in the light emitting panel is not limited in this embodiment. In some examples, the first direction D1 and the second direction D2 may be intersected. For example, an angle between the first direction D1 along a counterclockwise direction and the second direction D2 may be about 108 degrees to 132 degrees, for example, may be about 120 degrees. However, this embodiment is not limited thereto. For example, if the display region of the light emitting panel may be rectangular, then the first direction and the second direction may be perpendicular to each other.

In some examples, as shown in FIG. 1, a shape of a light emitting element 10 may be a triangle, for example, may be an equilateral triangle. For example, a side length of the light emitting element 10 may be about 9 mm to 11 mm, for example, may be about 10 mm. However, this embodiment is not limited thereto. In some other examples, the shape of the light emitting element 10 may be another shape such as a rectangle, a rhombus, a pentagon, or a hexagon.

In some examples, as shown in FIG. 1, a color of light emitted by a light emitting element 10 may be determined as desired. For example, the light emitting element 10 may emit red light, green light, blue light, white light, or the like. In some examples, the light emitting element 10 may be an Organic Light Emitting Diode (OLED). The light emitting element 10 may include a first electrode, a second electrode, and an organic emitting layer located between the first electrode and the second electrode. Driven by a voltage of the first electrode and the second electrode, light emitting properties of an organic material of the organic emitting layer may be used for emitting light according to a required grayscale. For example, the first electrode may be an anode, and the second electrode may be a cathode. However, this embodiment is not limited thereto. In this embodiment of the present disclosure, a part of the light emitting element used for emitting light may refer to a stacked portion of the first electrode, the organic emitting layer, and the second electrode of the light emitting element.

In some examples, as shown in FIG. 1, the bonding region B1 may be provided with multiple bonding pins B11. For example, multiple bonding pins B11 may be sequentially arranged along the first direction D1. Only several bonding pins and several signal traces are simply illustrated in FIG. 1. The multiple bonding pins B11 may include: at least one first ground pin, multiple first signal pins, and multiple second signal pins. The first ground pin may be located between a first signal pin and a second signal pin. The first ground pin may be electrically connected with a ground trace 13. For example, the ground trace 13 may be of an integrally structure with at least one first ground pin and extend from the bonding region B1 to the bezel region B2, the ground trace 13 may be arranged around the display region AA within the bezel region B2, and the second signal pin may be electrically connected with a second signal trace 12. For example, the second signal trace 12 may be of an integrally structure with at least one second signal pin, and may extend from the bonding region B1 to the bezel region B2, and the second signal trace 12 may be arranged around the display region AA within the bezel region B2. Within the bezel region B2, the second signal trace 12 may be located on a side of the ground trace 13 away from the display region AA. However, this embodiment is not limited thereto.

In some examples, as shown in FIG. 1, the first signal pin may be electrically connected with a first signal trace 11. For example, multiple first signal pins and multiple first signal traces may be electrically connected in one-to-one correspondence. A first signal trace 11 may be of an integrally structure with a first signal pin. At least one first signal line 11 may extend from the bonding region B1 to the bezel region B2 and be arranged on a side of the ground line 13 close to the display region AA. At least one first signal line 11 may extend from the bonding region B1 to the display region AA and be arranged in a gap between a 2n-th column and a (2n+1)-th column of light emitting elements 10, wherein n is an integer greater than 0. For example, in FIG. 1, as an example of numbering columns of light emitting elements from left to right, multiple first signal traces 11 may be arranged between a second column and a third column of light emitting elements 10, a fourth column and a fifth column of light emitting elements 10, a sixth column and a seventh column of light emitting elements 10, an eighth column and a ninth column of light emitting elements 10, and a tenth column and an eleventh column of light emitting elements 10. The first signal traces 11 may also be arranged in bezel regions B2 on the left side and the right side of the display region AA.

In some examples, multiple first signal trace 11 may be electrically connected with multiple light emitting elements 10 in one-to-one correspondence. A first signal trace 11 may be configured to provide a drive signal to a light emitting element 10. However, this embodiment is not limited thereto. For example, a first signal trace may be electrically connected with multiple light emitting elements, and is configured to provide a drive signal to the multiple light emitting elements.

Figure 2:
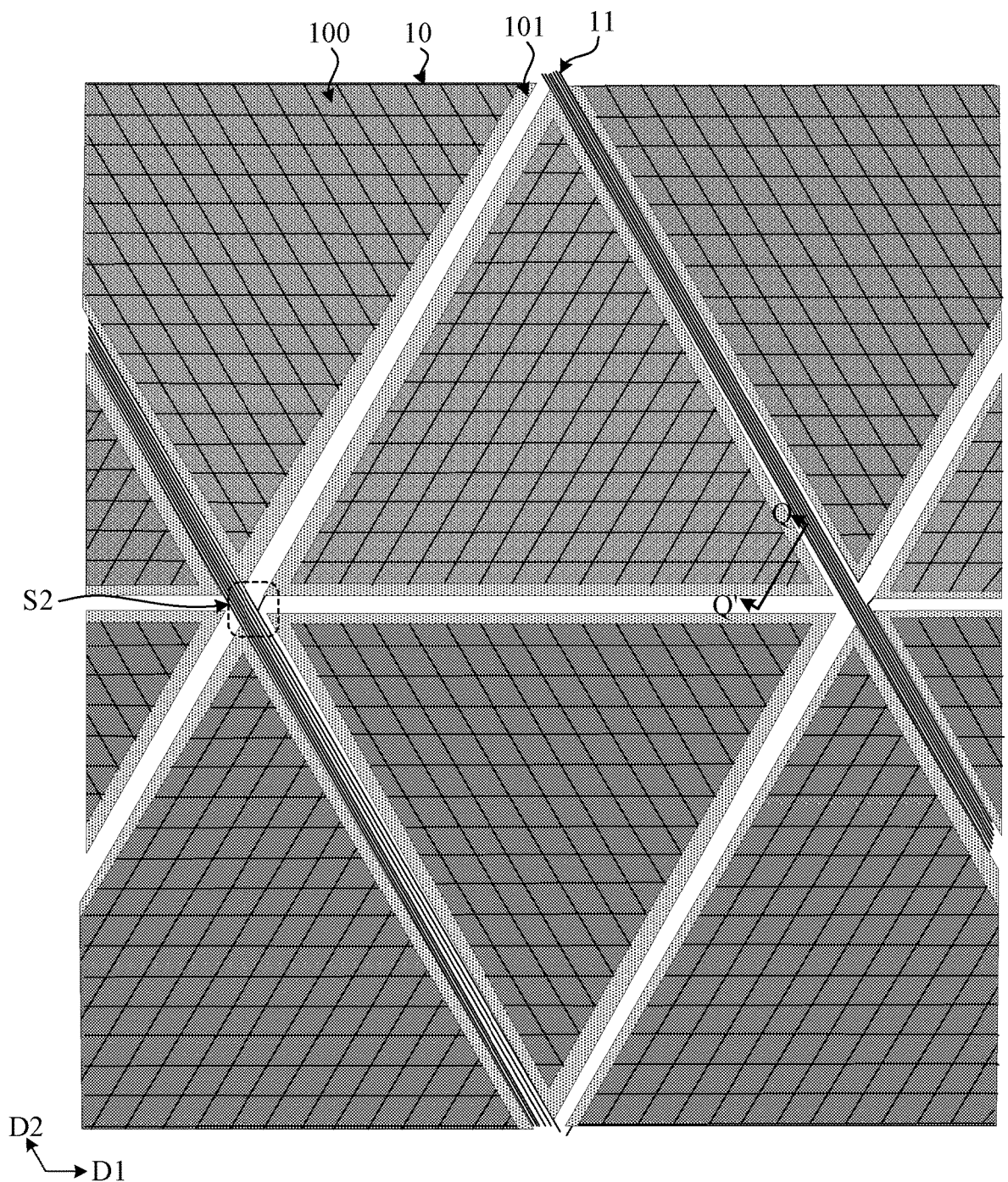
FIG. 2 is a partial enlarged schematic diagram of a region S1 in FIG. 1.
Figure 3:
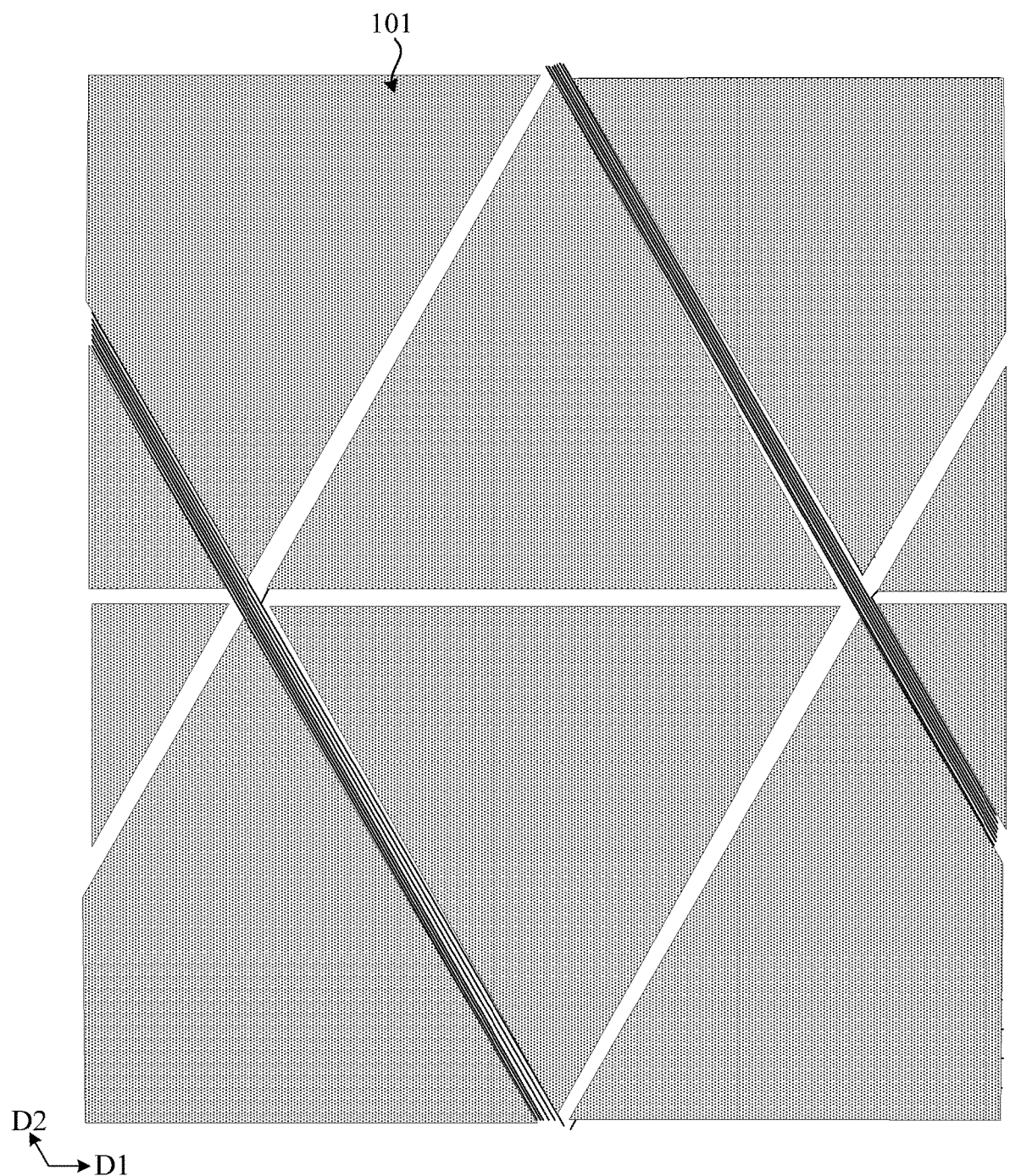
FIG. 3 is a schematic diagram of the light emitting panel after a second conductive layer is formed in FIG. 2.
Figure 4:
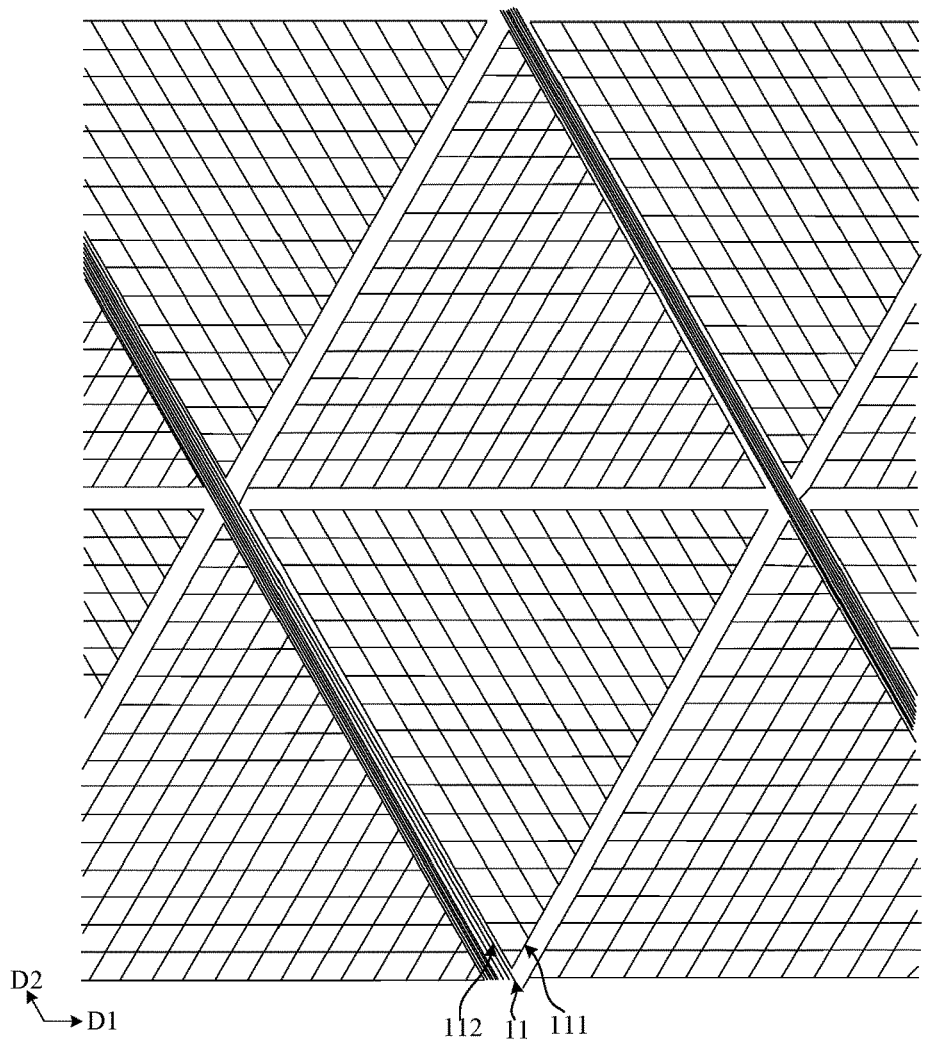
FIG. 4 is a schematic diagram of the light emitting panel after a first conductive layer is formed in FIG. 2.
Figure 5A:
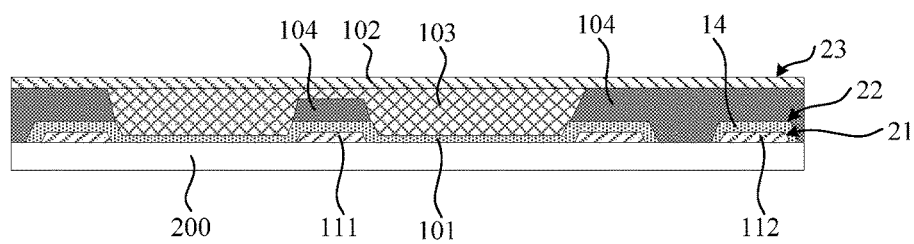
FIG. 5A is a partial cross-sectional schematic diagram taken along a Q-Q' direction in FIG. 2.
Figure 5B:
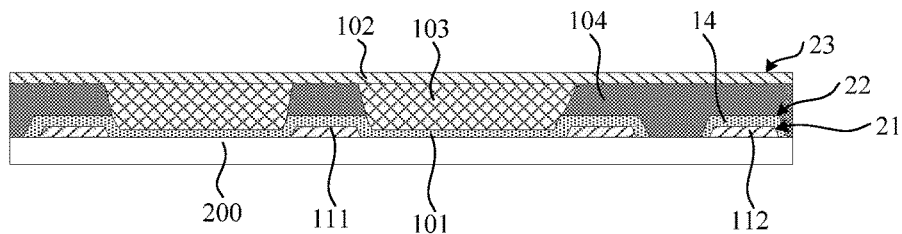
FIG. 5B is another partial cross-sectional schematic diagram taken along a Q-Q' direction in FIG. 2.
Figure 6:
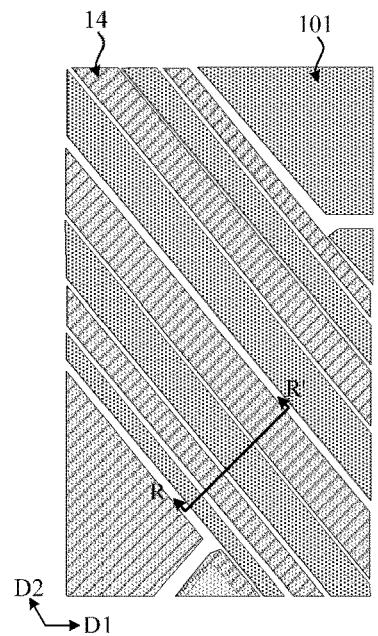
FIG. 6 is a partial enlarged schematic diagram of a region S2 in FIG. 2.
Figure 7:
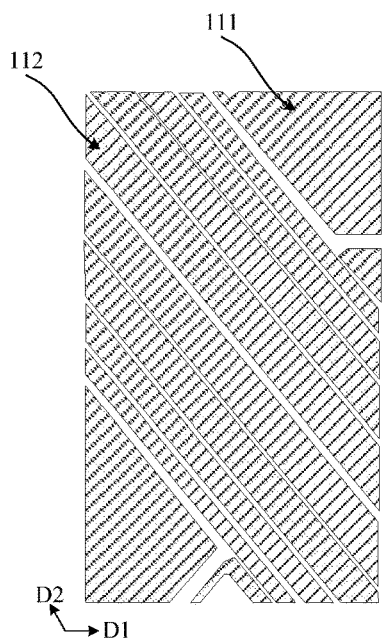
FIG. 7 is a schematic diagram of the first conductive layer in FIG. 6.
Figure 8:
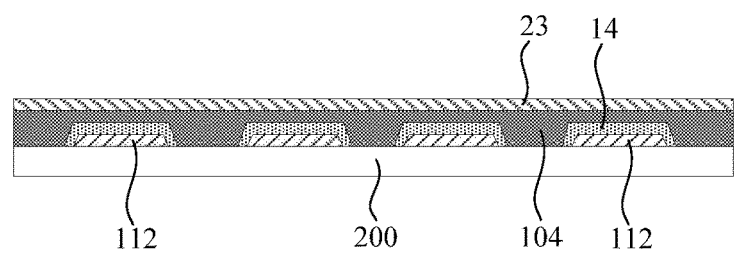
FIG. 8 is a partial cross-sectional schematic diagram taken along an R-R' direction in FIG. 6.

FIG. 2 is a partial enlarged schematic diagram of a region S1 in FIG. 1. FIG. 3 is a schematic diagram of the light emitting panel after a second conductive layer is formed in FIG. 2. FIG. 4 is a schematic diagram of the light emitting panel after a first conductive layer is formed in FIG. 2. FIG. 5A and FIG. 5B are partial cross-sectional schematic diagrams taken along a Q-Q' direction in FIG. 2. FIG. 6 is a partial enlarged schematic diagram of a region S2 in FIG. 2. FIG. 7 is a schematic diagram of the first conductive layer in FIG. 6. FIG. 8 is a partial cross-sectional schematic diagram taken along an R-R' direction in FIG. 6.

In some exemplary implementation modes, as shown in FIG. 2 to FIG. 8, in a direction perpendicular to the display substrate, the display region AA may include: a base substrate 200, and a first conductive layer 21, a second conductive layer 22, a pixel definition layer 104, an organic emitting layer 103, and a third conductive layer 23 sequentially disposed on the base substrate 200. In this example, the first conductive layer 21 is in direct contact with the second conductive layer 22, and no insulation layer is provided between the first conductive layer 21 and the second conductive layer 22.

In some examples, as shown in FIG. 4 and FIG. 7, the first conductive layer 21 of the display region AA may include multiple first signal traces 11. A first signal trace 11 may include a first extension portion 111 and a second extension portion 112. The second extension portion 112 may be arranged between adjacent columns of light emitting elements and may extend from the display region AA to the peripheral region BB along one direction. For example, the second extension portion 112 may extend along the second direction D2. Second extension portions 112 of multiple (e.g. eight or ten) first signal traces may be arranged between adjacent columns of light emitting elements. The second extension portion 112 of the first signal trace 11 is electrically connected with the first extension portion 111, for example, may be of an integral structure. An orthographic projection of the first extension portion 111 on the base substrate 200 may be overlapped with an orthographic projection of a first electrode 101 of a light emitting element on the base substrate 200. In some examples, as shown in FIG. 3 and FIG. 6, the orthographic projection of the first electrode 101 of the light emitting element on the base substrate 200 may cover the orthographic projection of the first extension portion 111 of the first signal trace 11 on the base substrate 200. As shown in FIG. 4, an orthographic projection of a region where the first extension portion 111 is located on the base substrate 200 may be in a shape of a triangle, such as an equilateral triangle. The first extension portion 111 may be grid-shaped. For example, the first extension portion 111 may include multiple grids, and shapes of the grids may include parallelograms and triangles. By providing the grid-shaped first extension portion 111, a resistance of the first signal trace 11 may be reduced. However, the shapes of the grids of the first extension portion are not limited in this embodiment. For example, a grid may be rectangular, rhombus, pentagonal, or hexagonal, etc.

In some examples, as shown in FIG. 3 and FIG. 6, the second conductive layer 22 may include first electrodes 101 of multiple light emitting elements and multiple auxiliary traces 14. A first electrode 101 of a light emitting element is in direct contact with a first extension portion 111 of a first signal trace 11, thereby achieving an electrical connection between the first electrode 101 of the light emitting element and the first signal trace 11. As shown in FIG. 6 and FIG. 8, within the display region, an orthographic projection of an auxiliary trace 14 on the base substrate 200 may cover an orthographic projection of a second extension portion 112 of the first signal trace 11 on the base substrate 200. In this example, the first conductive layer 21 of the display region AA may be covered by the second conductive layer 22 and the first conductive layer 21 may be protected using the second conductive layer 22 to avoid damage to the first conductive layer 21 in a preparation process.

In some examples, a first electrode 101 of a light emitting element 10 with which a first signal trace 11 is electrically connected and an auxiliary trace 14 covering a second extension portion 112 of the first signal trace 11 may be of an integrally structure. In this way, it may be ensured that the first conductive layer 21 is covered by the second conductive layer 22 of the display region.

In some examples, as shown in FIG. 2, the pixel definition layer 104 may be provided with multiple pixel openings 100 in the display region AA. The pixel definition layer 104 in a pixel opening 100 is removed, exposing at least part of a first electrode 101 of a light emitting element 10. As shown in FIG. 5A and FIG. 5B, the organic emitting layer 103 may be located in a pixel opening 100 and be in contact with the first electrode 101 of the light emitting element 10 through the pixel opening 100. The third conductive layer 23 may include second electrodes 102 of the multiple light emitting elements 10. A second electrode 102 of a light emitting element 10 may be located on a side of the pixel definition layer 104 away from the base substrate 200 and is in contact with the organic emitting layer 103. In some examples, the second electrodes 102 of the multiple light emitting elements 10 may be of an integral structure. However, this embodiment is not limited thereto.

In some examples, as shown in FIG. 2, a light emitting element 10 may include multiple sub-light emitting regions, and ne sub-light emitting region corresponds to one pixel opening 100. As shown in FIG. 5A and FIG. 5B, adjacent sub-light emitting regions of the light emitting element 10 may be separated by the pixel definition layer 104. An orthographic projection of the pixel definition layer 104 on the base substrate 200 may cover an orthographic projection of a first signal trace 11 on the base substrate 200. A shape of a sub-light emitting region of the light emitting element 10 may be substantially the same as a shape of a grid of a first extension portion 111 of the first signal trace 11. An orthographic projection of at least one grid of the first extension portion 111 may be overlapped with an orthographic projection of a sub-light emitting region of the light emitting element 10, for example, the orthographic projection of the grid may be overlapped with the orthographic projection of the sub-light emitting region of the light emitting element. For example, the shape of the sub-light emitting region of the light emitting element 10 may include a parallelogram and a triangle. However, this embodiment is not limited thereto. In some other examples, the shape of the sub-light emitting region of the light emitting element 10 may be a rectangle, a pentagon, or a hexagon, etc. In this example, the first extension portion 111 of the first signal trace 11 is covered by the pixel definition layer 104, so that the light emitting element 10 is divided into multiple sub-light emitting regions, an influence of the first extension portion 111 on light emission may be avoided, and flatness of the sub-light emitting regions may be ensured, thereby ensuring an effect of light emission.

In some examples, as shown in FIG. 5A, organic emitting layers 103 of adjacent sub-light emitting regions may be communicated. For example, a height of the pixel definition layer 104 between adjacent sub-light emitting regions of the light emitting element 10 may be lower than a height of the pixel definition layer 104 between adjacent light emitting elements 10, so that organic emitting layers 103 between adjacent sub-light emitting regions of the light emitting element may be communicated. In this example, a height of the pixel definition layer may refer to a vertical distance between a surface of the pixel definition layer on a side away from the base substrate and a surface of the base substrate on a side close to the pixel definition layer.

In some other examples, as shown in FIG. 5B, organic emitting layers 103 of adjacent sub-light emitting regions of the light emitting element 10 may not be communicated. The pixel definition layer 104 between adjacent sub-light emitting regions of the light emitting element 10 may be in contact with a second electrode 102 of the light emitting element 10.

Figure 9A:
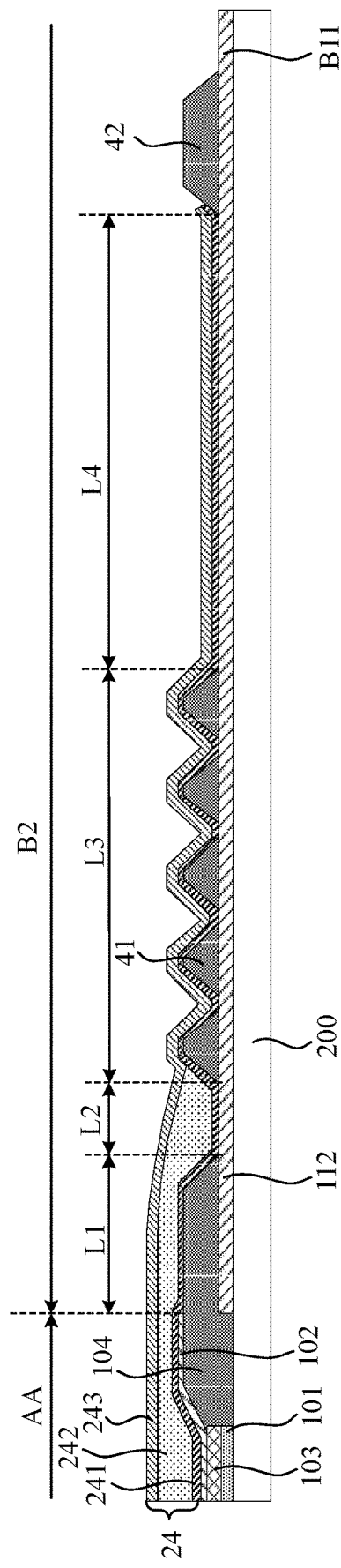
FIG. 9A is a partial cross-sectional schematic diagram taken along a P-P' direction in FIG. 1.

FIG. 9A is a partial cross-sectional schematic diagram taken along a P-P' direction in FIG. 1. In some examples, as shown in FIG. 9A, an encapsulation layer 24 is disposed on a side of the second electrode 102 of the light emitting element 10 away from the base substrate 200. The encapsulation layer may include a first encapsulation layer 241, a second encapsulation layer 242, and a third encapsulation layer 243 which are sequentially stacked. Among them, the first encapsulation layer 241 and the third encapsulation layer 243 may be made of an inorganic material, and the second encapsulation layer 242 may be made of an organic material. The second extension portion 112 of the first signal trace 11 may extend from the display region AA to the bonding region B1, and be electrically connected with the bonding pin B11 of the bonding region B1. In this example, the second extension portion 112 of the first signal trace 11 and the bonding pin B11 of the bonding region B1 may be of an integrally structure. A barrier dam region is provided in the peripheral region BB, and multiple barrier dams 41 are provided within the barrier dam region. For example, five barrier dams 41 are provided within the barrier dam region, and the five barrier dams 41 may be arranged continuously along a side away from the display region AA. A surface of the barrier dam region on a side away from the base substrate 200 may be wavy. The barrier dams 41 and the pixel definition layer 104 of the display region AA may be of a same-layer structure. The first encapsulation layer 241 and the third encapsulation layer 243 of the encapsulation layer 24 may cover surfaces of the multiple barrier dams 41 away from the base substrate 200. By providing the multiple barrier dams 41, it may be ensured that the second encapsulation layer 242 made of an organic material is blocked. In this example, each barrier dam 41 may be disposed around the display region AA in the peripheral region BB and be of an annular structure. As shown in FIG. 9A, a pin protection portion 42 is further provided in the bonding region B1. The pin protection portion 42 and the pixel definition layer 104 of the display region AA may be of a same-layer structure. The pin protection portion 42 may expose the bonding pin B11 of the bonding region B1.

In some examples, as shown in FIG. 9A, second electrodes 102 of multiple light emitting elements 10 of the display region AA may be of an integral structure. A distance L1 between an edge of a second electrode 102 of a light emitting element 10 and an edge of the pixel definition layer 104 may be about 300 microns. A distance L2 between the edge of the pixel definition layer 104 and an edge of the barrier dam region on a side close to the display region AA may be about 100 microns. A distance L3 between the edge of the barrier dam region on the side close to the display region AA and an edge of the barrier dam region on a side away from the display region AA may be about 360 microns. In this example, a total length of five barrier dams 41 along a direction away from the display region AA may be about 360 microns. A distance L4 between an edge of the barrier dam region on a side away from the display region AA and edges of the first encapsulation layer 241 and the third encapsulation layer 243 may be about 1600 microns. In the bonding region B1, orthographic projections of the first encapsulation layer 241 and the third encapsulation layer 243 on the base substrate 200 may be partially overlapped with an orthographic projection of the pin protection portion 42 on the base substrate 200. However, this embodiment is not limited thereto.

Figure 9B:
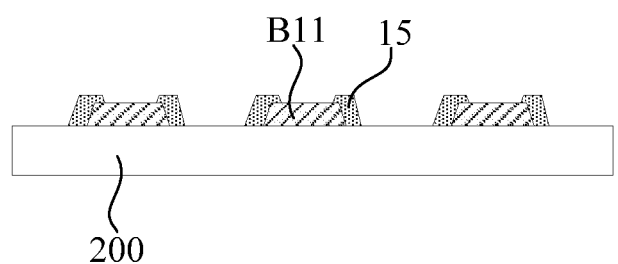
FIG. 9B is a partial cross-sectional schematic diagram taken along a U-U' direction in FIG. 1.

FIG. 9B is a partial cross-sectional schematic diagram taken along a Q-Q' direction in FIG. 1. In some examples, as shown in FIG. 9B, the second conductive layer may include an auxiliary electrode 15 located in the peripheral region BB. An orthographic projection of the auxiliary electrode 15 on the base substrate 200 is partially overlapped with an orthographic projection of the bonding pin B11 on the base substrate 200. The auxiliary electrode 15 may cover a side surface of the bonding pin B11 and expose a surface of the bonding pin B11 on a side away from the base substrate 200. In this example, the bonding pin is wrapped using the second conductive layer to prevent the bonding pin from being corroded.

In some examples, an auxiliary trace 14 may extend from the display region AA to the peripheral region BB, and an extension direction of the auxiliary trace 14 may be the same as an extension direction of a second extension portion 112 of a corresponding first signal trace 11. In the peripheral region BB, an orthographic projection of the auxiliary trace 14 on the base substrate 200 may be partially overlapped with an orthographic projection of the second extension portion 112 on the base substrate 200. In the peripheral region BB, the auxiliary trace 14 may cover a side surface of the second extension portion 112 and expose a surface of the second extension portion 112 on a side away from the base substrate 200. In the peripheral region BB, an overlapping relationship between the auxiliary trace 14 and the second extension portion 112 may be referred to an overlapping relationship between the auxiliary electrode 15 and the bonding pin B11 shown in FIG. 9B, which will not be repeated here. In some examples, the first conductive layer of the peripheral region BB may include: multiple first signal trace 11, a second signal trace 12, a ground trace 13, and multiple bonding pins B11. In the peripheral region BB, traces and pins of the first conductive layer may be wrapped and protected using the second conductive layer. However, this embodiment is not limited thereto. In some other examples, traces of the first conductive layer of the peripheral region BB may be covered by the second conductive layer, and pins of the first conductive layer may be wrapped and protected by the second conductive layer.

A preparation process of the light emitting panel of this example is exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in the present disclosure. A "thin film" refers to a layer of thin film made of a material on a base substrate using deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". In an exemplary embodiment of the present disclosure, "an orthographic projection of A includes an orthographic projection of B" refers to that a boundary of the orthographic projection of B falls within a range of a boundary of the orthographic projection of A, or a boundary of the orthographic projection of A is overlapped with a boundary of the orthographic projection of B.

Figure 10:
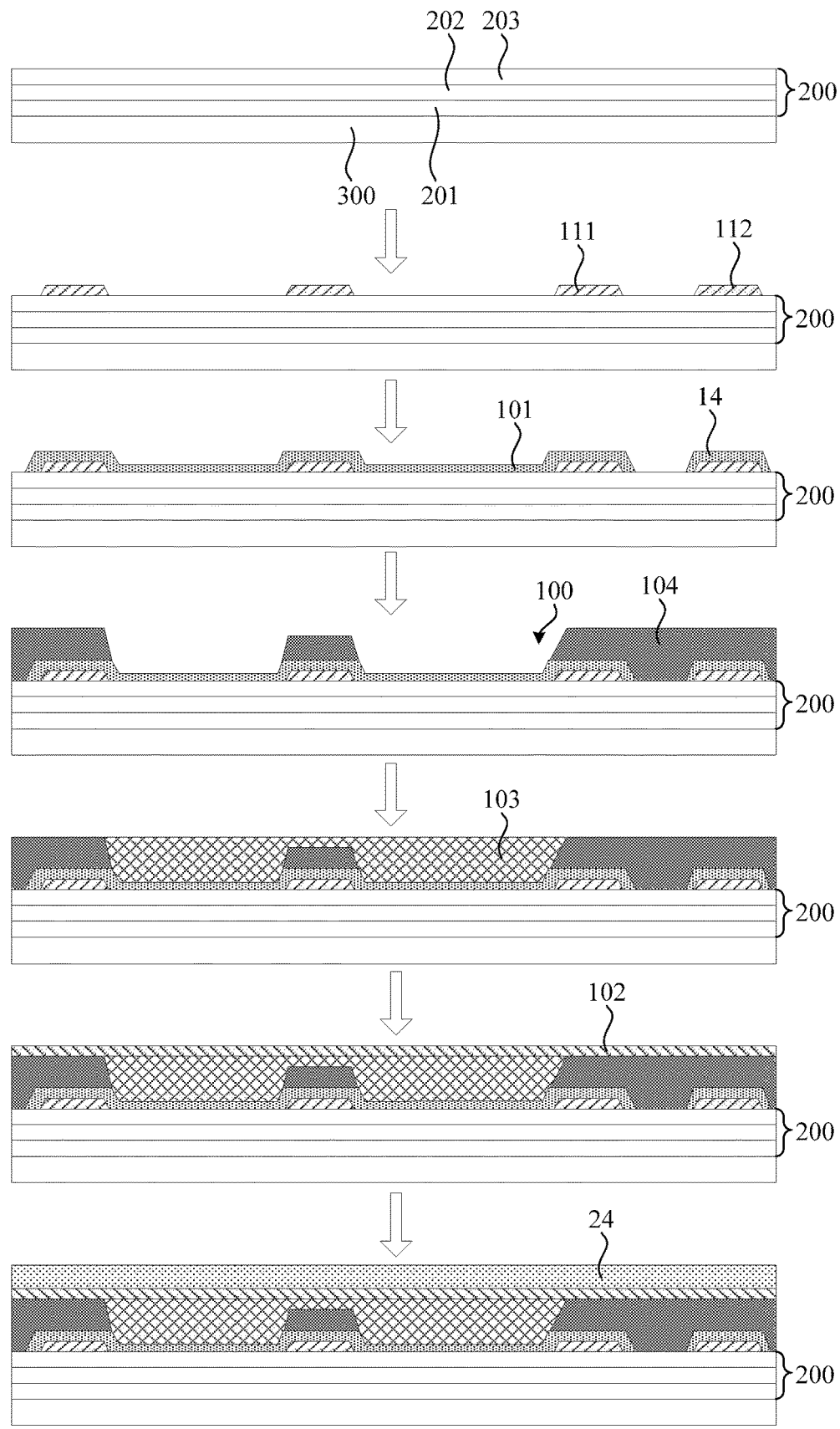
FIG. 10 is an example diagram of a preparation flow of a light emitting panel according to at least one embodiment of the present disclosure.

In some exemplary implementation modes, as shown in FIG. 10, the preparation process of the light emitting panel may include following operations.

(1) A Base Substrate is Prepared.

In some exemplary implementation modes, a glass base 300 is provided and a base substrate 200 is formed on the glass base 300. The base substrate 200 may include a flexible base substrate 201, a barrier layer 202, and a buffer layer 203 which are stacked. The barrier layer 202 and the buffer layer 203 may be used for improving a water blocking capability of the base substrate 200. For example, the flexible base substrate 201 may be made of a material such as Polyimide (PI), Polyethylene Terephthalate (PET), or a surface-treated polymer soft film, and the barrier layer 202 and buffer layer 203 may be made of an inorganic material, for example, may be made of any one or more of Silicon Oxide (SiOx), Silicon Nitride (SiNx), and Silicon OxyNitride (SiON), and may be a single layer, a multi-layer, or a composite layer. For example, SiOx may be adopted for the barrier layer 202, and SiNx may be adopted for the buffer layer 203. However, this embodiment is not limited thereto. In some other examples, the base substrate may be a rigid substrate, such as a glass substrate.

(2) A First Conductive Layer is Formed.

In some exemplary implementation modes, a first conductive thin film is deposited on the base substrate 200 on which the aforementioned structure is formed and the first conductive thin film is patterned through a patterning process to form the first conductive layer 21. For example, the first conductive layer 21 may include: multiple first signal traces 11, a second signal trace 12, a ground trace 13, and multiple bonding pins B11. The multiple bonding pins B11 may be located in the bonding region B1, the ground trace 13 and the second signal trace 12 may be located in the peripheral region BB, and a first signal trace 11 may extend from the peripheral region BB to the display region AA. For example, the first signal trace 11 may include a first extension portion 111 and a second extension portion 112 in the display region AA.

In some examples, the first conductive layer 21 may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Ti/Al/Ti. For example, the material of the first conductive layer 21 may include Ti/Al/Ti or may include Mo/Al/Mo.

(3) A Second Conductive Layer is Formed.

In some exemplary implementation modes, a second conductive thin film is deposited on the base substrate on which the aforementioned structures are formed, and the second conductive thin film is patterned through a patterning process to form the second conductive layer 22 located in the display region AA. For example, the second conductive layer 22 may include: first electrodes 101 of multiple light emitting elements 10, multiple auxiliary trace 14, and multiple auxiliary electrodes 15 located in the display region AA. The second conductive layer 22 of the display region AA may cover the first conductive layer 21 of the display region AA, thereby protecting the first conductive layer 21 and avoiding damage to the first conductive layer 21 in a preparation process of the second conductive layer 22. For example, in the display region AA, an orthographic projection of a first electrode 101 of a light emitting element 10 on the base substrate 200 may cover an orthographic projection of a first extension portion 111 of a first signal trace 11 on the base substrate 200, and an orthographic projection of an auxiliary trace 14 on the base substrate 200 may cover an orthographic projection of a second extension portion 112 of the first signal trace 11 on the base substrate 200.

(4) A Pixel Definition Layer is Formed.

In some exemplary implementation modes, a pixel definition thin film is coated on the base substrate 200 on which the aforementioned patterns are formed, and a pixel definition layer 104 is formed through mask, exposure, and development processes. The pixel definition layer 104 may have multiple pixel openings 100 exposing the second conductive layer 22. The multiple pixel openings 100 may be located within the display region AA. In some examples, the pixel definition layer 104 between adjacent sub-light emitting regions of a light emitting element 10 may be thinned, so that a height of the pixel definition layer between adjacent sub-light emitting regions may be smaller than a height of the pixel definition layer between adjacent light emitting elements. In some examples, the pixel definition layer 104 may be made of organic materials such as polyimide, acrylic, or polyethylene terephthalate, etc.

(5) An Organic Emitting Layer is Formed.

In some exemplary implementation modes, the organic emitting layer 103 is formed in a pixel opening 100 formed above, and the organic emitting layer 103 may be in contact with a first electrode 101 of a light emitting element. In some examples, a hole injection layer and a hole transport layer are formed by sequentially evaporating on the base substrate 200 on which the aforementioned patterns are formed using an Open Mask, then a blue emitting layer, a green emitting layer, and a red emitting layer are formed by sequentially evaporating using a Fine Metal Mask (FMM), and then an electron transport layer and an electron injection layer are formed by sequentially evaporating using an Open Mask. In this example, a light emitting element 10 may emit white light. However, this embodiment is not limited thereto.

(6) A Third Conductive Layer is Formed.

In some exemplary implementation modes, a third conductive thin film is deposited on the base substrate 200 on which the aforementioned patterns are formed, and the third conductive thin film is patterned through a patterning process to form the third conductive layer 23, and the third conductive layer 23 may include second electrodes 102 of multiple light emitting elements. The second electrodes 102 of the multiple light emitting elements may be of an integral structure. A second electrode 102 may be formed on the pixel definition layer 104 and be in contact with the organic emitting layer 103 of a light emitting element. The second electrode 102 may be electrically connected with the second signal trace 12 located in the first conductive layer 21 in the bezel region B2.

(7) An Encapsulation Layer is Formed.

In some exemplary implementation modes, the encapsulation layer 24 is formed on the third conductive layer 23. The encapsulation layer 24 may include a stacked structure of an inorganic material/an organic material/an inorganic material. However, this embodiment is not limited thereto.

After preparation of the light emitting panel is completed, the glass base 300 may be peeled off.

In some exemplary implementation modes, the second conductive layer 22 may be made of a transparent conductive material, such as Indium Tin Oxide (ITO). The third conductive layer 23 may be made of a reflective material such as metal, for example, Argentum (Ag). The light emitting panel of this example may be of a bottom emission structure, i.e., the light emitting panel emits light from a side of the base substrate 200. However, this embodiment is not limited thereto. In some other examples, the light emitting panel of this example may be of a top emission structure, that is, the light emitting panel emits light from a side away from the base substrate. Among them, the second conductive layer may be made of a reflective material such as metal, and the third conductive layer may be made of a transparent conductive material.

Illumination display required by the light emitting panel of the example does not need to control a light emitting element through a complex pixel circuit, but drives the light emitting element by leading out a drive signal through a first signal trace and a second signal trace. By providing the first conductive layer 21 in direct contact with the second conductive layer 22 in the display region AA, the first conductive layer 21 may be protected using the second conductive layer 22 to avoid damage to the first conductive layer 21 in a preparation process, and no insulation layer needs to be prepared between the first conductive layer 21 and the second conductive layer 22, thus saving a preparation process and greatly reducing a cost.

Figure 11:
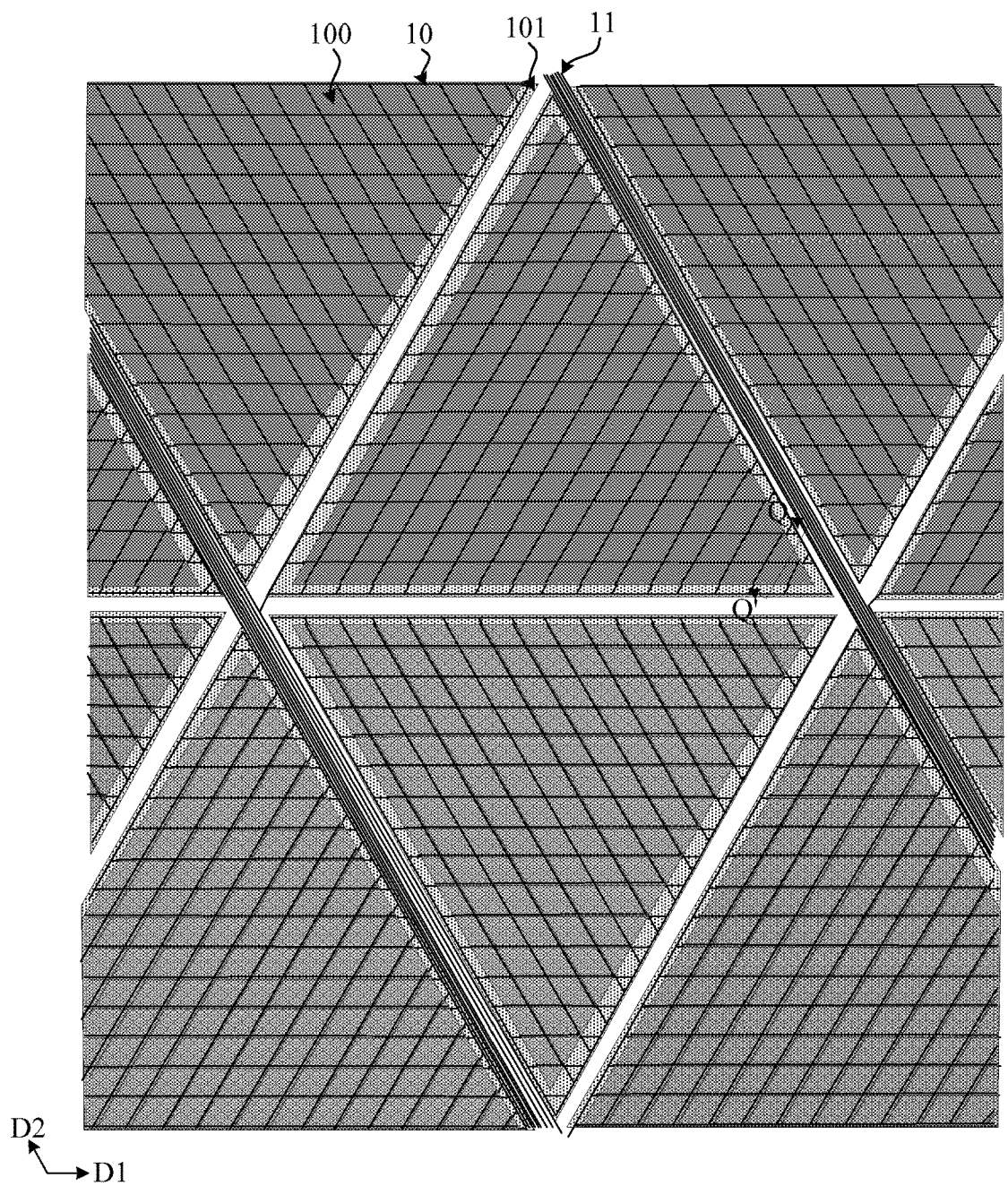
FIG. 11 is another partial enlarged schematic diagram of the region S1 in FIG. 1.
Figure 12:
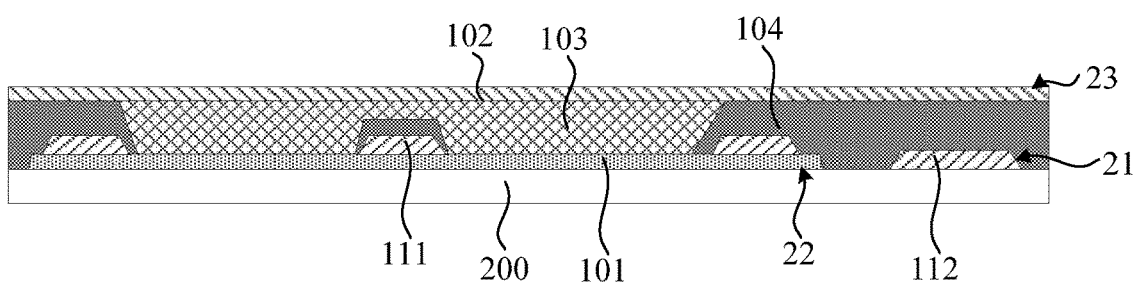
FIG. 12 is a partial cross-sectional schematic diagram taken along a Q-Q' direction in FIG. 11.

FIG. 11 is another partial enlarged schematic diagram of the region S1 in FIG. 1. FIG. 12 is a partial cross-sectional schematic diagram along Q-Q' in FIG. 11. In some exemplary implementation modes, as shown in FIG. 11 and FIG. 12, the display region AA may include: a base substrate 200, and a second conductive layer 22, a first conductive layer 21, a pixel definition layer 104, an organic emitting layer 103, and a third conductive layer 23 sequentially disposed on the base substrate 200. In this example, no insulation layer is provided between the first conductive layer 21 and the second conductive layer 22, and the first conductive layer 21 may be located on a side of the second conductive layer 22 away from the base substrate 200.

In some examples, as shown in FIG. 11 and FIG. 12, the first conductive layer 21 of the display region AA may include: multiple first signal traces 11. The second conductive layer 22 may include: a first electrode 101 of a light emitting element 10. The first conductive layer 21 and the second conductive layer 22 are in direct contact. The first electrode 101 of the light emitting element 10 may be in direct contact with a first extension portion 111 of a first signal trace 11, thereby achieving an electrical connection with the first signal trace 11. An orthographic projection of a second extension portion 112 of the first signal trace 11 on the base substrate 200 may not be overlapped with an orthographic projection of the second conductive layer 22 on the base substrate 200.

In some examples, as shown in FIG. 11 and FIG. 12, the second conductive layer 22 and the first conductive layer 21 may be respectively prepared using a wet etching process in a preparation process of the light emitting panel. In a preparation process of the first conductive layer 21, an etching process may be performed using an etching liquid that does not damage the second conductive layer 22. In some examples, the first conductive layer 21 may be made of a metal material, and the second conductive layer 22 may be made of a transparent conductive material, such as ITO.

For rest of the description of the light emitting panel of this embodiment, reference may be made to the description of the foregoing embodiments, so details will not be repeated here.

Figure 13:
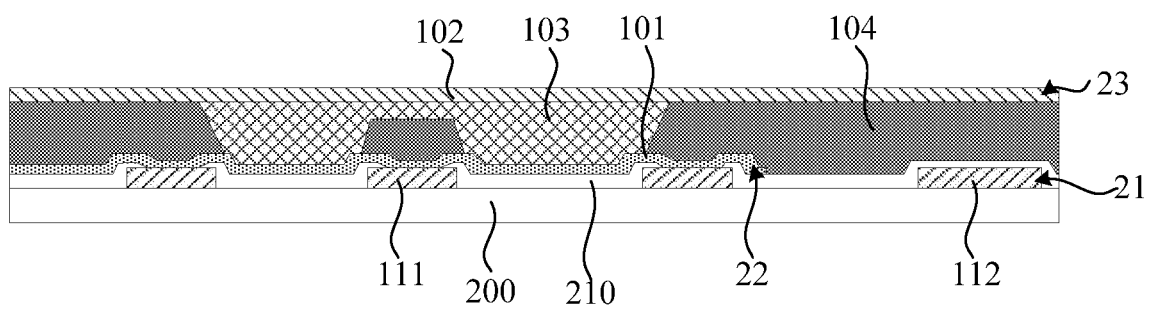
FIG. 13 is another partial cross-sectional schematic diagram taken along a Q-Q' direction in FIG. 2.

FIG. 13 is another partial cross-sectional schematic diagram taken along a Q-Q' direction in FIG. 2. In some exemplary implementation modes, as shown in FIG. 13, the display region AA may include: a base substrate 200, and a first conductive layer 21, a first insulation layer 210, a second conductive layer 22, a pixel definition layer 104, an organic emitting layer 103, and a third conductive layer 23 sequentially disposed on the base substrate 200. In this example, a first insulation layer 210 is provided between the first conductive layer 21 and the second conductive layer 22.

For example, the first insulation layer 210 may be made of an inorganic material, such as any one or more of Silicon Oxide (SiOx), Silicon Nitride (SiNx), and Silicon OxyNitride (SiON), and may be a single layer, a multi-layer, or a composite layer.

In some examples, as shown in FIG. 13, the second conductive layer 22 may include: a first electrode 101 of a light emitting element. The first electrode 101 of the light emitting element may be electrically connected with a first signal trace 11 of the first conductive layer 21 through a via provided in the first insulation layer 210. For example, the first electrode 101 of the light emitting element may be electrically connected with a first extension portion 111 of the first signal trace 11 through a via provided in the first insulation layer 210. In some examples, the first insulation layer 210 on the first extension portion 111 of the first signal trace 11 may be completely removed, exposing the entire first extension portion 111; or, the first insulation layer 210 may be removed to expose a portion of the first extension portion 111. However, this embodiment is not limited thereto.

In some examples, as shown in FIG. 13, an orthographic projection of a part of a light emitting element used for emitting light on the base substrate 200 may be overlapped with an orthographic projection of the first insulation layer 210 on the base substrate 200. In other words, the first insulation layer 210 on a side of a first electrode 101 of the light emitting element close to the base substrate 200 may be retained, only a portion of the first insulation layer 210 that may expose a surface of a first signal trace 11 is removed, so that a surface of the light emitting element on a side close to the base substrate 200 may be a flat surface, and an uneven first electrode caused by etching the first insulation layer 210 is avoided, thereby ensuring a display effect of the light emitting panel.

For rest of the description of the light emitting panel of this embodiment, reference may be made to the description of the foregoing embodiments, so details will not be repeated here.

An embodiment of the present disclosure also provides a preparation method of a light emitting panel. The light emitting panel includes a display region and a peripheral region located on at least one side of the display region. The display region is provided with at least one light emitting element, and the light emitting element includes a first electrode, a second electrode, and an organic emitting layer disposed between the first electrode and the second electrode. The preparation method includes: forming a first conductive layer and a second conductive layer on a base substrate. The first conductive layer includes at least one first signal trace, and the second conductive layer includes: a first electrode of the light emitting element; the first conductive layer is in direct contact with the second conductive layer, and the first electrode of the light emitting element is connected with the first signal trace.

In some exemplary implementation modes, the first signal trace in the display region may include: a first extension portion. The first extension portion is grid-shaped, and an orthographic projection of the first extension portion on the base substrate is overlapped with an orthographic projection of the first electrode of the light emitting element electrically connected with the first signal trace on the base substrate.

In some exemplary implementation modes, the forming the first conductive layer and the second conductive layer on the base substrate may include: sequentially forming the first conductive layer and the second conductive layer that are in direct contact on the base substrate, wherein in the display region, an orthographic projection of the second conductive layer on the base substrate covers an orthographic projection of the first conductive layer on the base substrate; or, sequentially forming the second conductive layer and the first conductive layer that are in direct contact on the base substrate.

In some exemplary implementation modes, the preparation method of the embodiment may further include: forming a pixel definition layer on the base substrate, wherein the pixel definition layer has multiple pixel openings and a pixel opening exposes at least a portion of the first electrode of the light emitting element; and forming an organic emitting layer and a second electrode of the light emitting element. Among them, the organic emitting layer of the light emitting element is in contact with the first electrode of the light emitting element through the pixel opening; the second electrode of the light emitting element is in contact with the organic emitting layer of the light emitting element.

Regarding the preparation method of the light emitting panel of this embodiment, reference may be made to descriptions of the aforementioned embodiments, and thus will not be repeated here.

An embodiment of the present disclosure also provides a preparation method of a light emitting panel. The light emitting panel includes a display region and a peripheral region located on at least one side of the display region; the display region is provided with at least one light emitting element, and the light emitting element includes a first electrode, a second electrode, and an organic emitting layer disposed between the first electrode and the second electrode. The preparation method includes: sequentially forming a first conductive layer, a first insulation layer, and a second conductive layer on a base substrate. The first conductive layer includes at least one first signal trace, the second conductive layer includes: a first electrode of the light emitting element, the first electrode of the light emitting element is connected with the first signal trace through a via provided in the first insulation layer, and an orthographic projection of the first insulation layer on the base substrate is overlapped with an orthographic projection of a part of the light emitting element used for emitting light on the base substrate.

Regarding the preparation method of the light emitting panel of this embodiment, reference may be made to descriptions of the aforementioned embodiments, and thus will not be repeated here.

An embodiment of the present disclosure also provides a light emitting apparatus, including the light emitting panel as described above.

Figure 14:
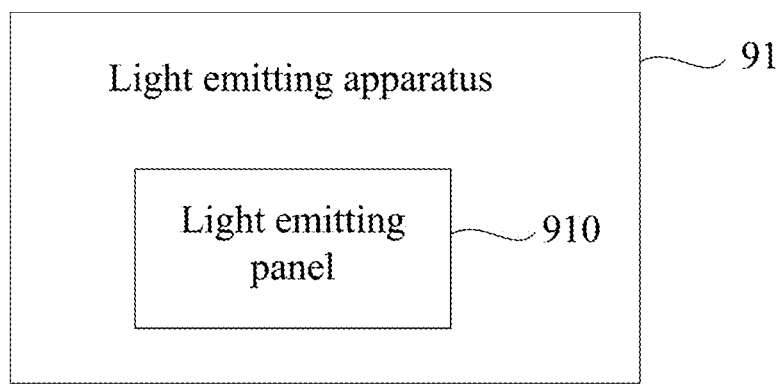
FIG. 14 is a schematic diagram of a light emitting apparatus according to at least one embodiment of the present disclosure.

FIG. 14 is a schematic diagram of a light emitting apparatus according to at least one embodiment of the present disclosure. In some examples, as shown in FIG. 14, a light emitting apparatus 91 may include a light emitting panel 910. In some examples, a bonding pin of a light emitting panel may be bound and connected with a Flexible Printed Circuit (FPC), and the flexible printed circuit may also be electrically connected with a drive circuit board.

In some exemplary implementation modes, the light emitting panel 910 may be a flexible OLED display substrate or a QLED display substrate. The light emitting apparatus 91 may be any vehicle-mounted product or component with a display function, such as a vehicle light, a vehicle-mounted light emitting device, and a navigator. The light emitting panel of the embodiment may simplify a preparation process, improve quality of the light emitting panel, and reduce a cost.

The drawings of the present disclosure only involve structures involved in the present disclosure, and other structures may refer to conventional designs. The embodiments of the present disclosure and features in the embodiments may be combined with each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A light emitting panel, comprising: a display region and a peripheral region located on at least one side of the display region; the display region is provided with at least one light emitting element, and the light emitting element comprises a first electrode, a second electrode, and an organic emitting layer disposed between the first electrode and the second electrode;

in a direction perpendicular to the light emitting panel, the light emitting panel at least comprises: a base substrate, and a first conductive layer and a second conductive layer disposed on the base substrate;

the first conductive layer comprises: at least one first signal trace;

the second conductive layer comprises: a first electrode of the light emitting element;

wherein the first conductive layer is in direct contact with the second conductive layer, and the first electrode of the light emitting element is directly connected with the first signal trace; or, a first insulation layer is disposed between the first conductive layer and the second conductive layer, the first electrode of the light emitting element is connected with the first signal trace through a via provided in the first insulation layer, and an orthographic projection of the first insulation layer on the base substrate is overlapped with an orthographic projection of a part of the light emitting element used for emitting light on the base substrate.

2. The light emitting panel according to claim 1, wherein the first signal trace in the display region comprises: a first extension portion; the first extension portion is grid-shaped, and an orthographic projection of the first extension portion on the base substrate is overlapped with an orthographic projection of the first electrode of the light emitting element electrically connected with the first signal trace on the base substrate.

3. The light emitting panel according to claim 2, wherein the first signal trace further comprises: a second extension portion, the second extension portion extends from the display region to the peripheral region, and the second extension portion is connected with the first extension portion.

4. The light emitting panel according to claim 3, wherein the display region is further provided with at least one auxiliary trace, and the auxiliary trace and the first electrode of the light emitting element are of a same-layer structure; the auxiliary trace is in direct contact with the second extension portion of the first signal trace, and an orthographic projection of the auxiliary trace on the base substrate is overlapped with an orthographic projection of the second extension portion of the first signal trace on the base substrate.

5. The light emitting panel according to claim 1, wherein the second conductive layer is in direct contact with the first conductive layer, and the second conductive layer is located on a side of the first conductive layer away from the base substrate.

6. The light emitting panel according to claim 5, wherein in the display region, an orthographic projection of the second conductive layer on the base substrate covers an orthographic projection of the first conductive layer on the base substrate.

7. The light emitting panel according to claim 5, wherein in the peripheral region, an orthographic projection of the second conductive layer on the base substrate is partially overlapped with an orthographic projection of the first conductive layer on the base substrate.

8. The light emitting panel according to claim 1, wherein the second conductive layer is in direct contact with the first conductive layer, and the second conductive layer is located on a side of the first conductive layer close to the base substrate.

9. The light emitting panel according to claim 1, wherein the display region is further provided with a pixel definition layer having multiple pixel openings, a pixel opening exposes at least a portion of the first electrode of the light emitting element; the organic emitting layer of the light emitting element is in contact with the first electrode of the light emitting element through the pixel opening; the second electrode of the light emitting element is located on a side of the pixel definition layer away from the base substrate, and the second electrode of the light emitting element is in contact with the organic emitting layer of the light emitting element; a part of the light emitting element located at the pixel opening is used for emitting light.

10. The light emitting panel according to claim 9, wherein in the display region, an orthographic projection of the pixel definition layer on the base substrate covers an orthographic projection of the first conductive layer on the base substrate.

11. The light emitting panel according to claim 9, wherein the peripheral region is provided with multiple barrier dams, at least one of the multiple barrier dams surrounds the display region; the multiple barrier dams and the pixel definition layer are of a same-layer structure, and the multiple barrier dams are sequentially and continuously arranged along a direction away from the display region.

12. The light emitting panel according to claim 11, wherein along the direction away from the display region, a total length of the multiple barrier dams is greater than 144 microns.

13. The light emitting panel according to claim 1, wherein a material of the first conductive layer comprises a metal material, and a material of the second conductive layer comprises a transparent conductive material.

14. A light emitting apparatus, comprising a light emitting panel according to claim 1.

15. A preparation method of a light emitting panel, wherein the light emitting panel comprises a display region and a peripheral region located on at least one side of the display region; the display region is provided with at least one light emitting element, the light emitting element comprises a first electrode, a second electrode, and an organic emitting layer disposed between the first electrode and the second electrode; the preparation method comprises:

forming a first conductive layer and a second conductive layer on a base substrate, wherein the first conductive layer comprises at least one first signal trace, and the second conductive layer comprises: a first electrode of the light emitting element; the first conductive layer is in direct contact with the second conductive layer, and the first electrode of the light emitting element is connected with the first signal trace.

16. The preparation method according to claim 15, wherein the first signal trace in the display region comprises: a first extension portion; the first extension portion is grid-shaped, and an orthographic projection of the first extension portion on the base substrate is overlapped with an orthographic projection of the first electrode of the light emitting element electrically connected with the first signal trace on the base substrate.

17. The preparation method according to claim 15, wherein the forming the first conductive layer and the second conductive layer on the base substrate comprises:

sequentially forming the first conductive layer and the second conductive layer that are in direct contact on the base substrate, wherein in the display region, an orthographic projection of the second conductive layer on the base substrate covers an orthographic projection of the first conductive layer on the base substrate;

or, sequentially forming the second conductive layer and the first conductive layer that are in direct contact on the base substrate.

18. The preparation method according to claim 15, further comprising:

forming a pixel definition layer on the base substrate, wherein the pixel definition layer has multiple pixel openings, a pixel opening exposes at least a portion of the first electrode of the light emitting element;

forming an organic emitting layer and a second electrode of the light emitting element; wherein the organic emitting layer of the light emitting element is in contact with the first electrode of the light emitting element through the pixel opening; the second electrode of the light emitting element is in contact with the organic emitting layer of the light emitting element.

19. A preparation method of a light emitting panel, wherein the light emitting panel comprises a display region and a peripheral region located on at least one side of the display region; the display region is provided with at least one light emitting element, the light emitting element comprises a first electrode, a second electrode, and an organic emitting layer disposed between the first electrode and the second electrode; the preparation method comprises:

sequentially forming a first conductive layer, a first insulation layer, and a second conductive layer on a base substrate; the first conductive layer comprises at least one first signal trace, the second conductive layer comprises: a first electrode of the light emitting element, the first electrode of the light emitting element is connected with the first signal trace through a via provided in the first insulation layer, and an orthographic projection of the first insulation layer on the base substrate is overlapped with an orthographic projection of a part of the light emitting element used for emitting light on the base substrate.

20. The light emitting panel according to claim 2, wherein the second conductive layer is in direct contact with the first conductive layer, and the second conductive layer is located on a side of the first conductive layer away from the base substrate.

* * * * *